US012763752B2

(12) United States Patent
Yantchev et al.

(10) Patent No.: US 12,763,752 B2
(45) Date of Patent: Oct. 13, 2026

(54) TRANSVERSELY-EXCITED FILM BULK ACOUSTIC RESONATORS WITH IMPROVED EDGE EFFECTS

(71) Applicant: Murata Manufacturing Co., Ltd., Nagaokakyo (JP)

(72) Inventors: Ventsislav Yantchev, Sofia (BG); Bryant Garcia, Belmont, CA (US)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 1245 days.

(21) Appl. No.: 17/511,091

(22) Filed: Oct. 26, 2021

(65) Prior Publication Data

US 2022/0166401 A1 May 26, 2022

Related U.S. Application Data

(63) Continuation-in-part of application No. 17/490,168, filed on Sep. 30, 2021, now Pat. No. 11,405,020.

(60) Provisional application No. 63/136,203, filed on Jan. 11, 2021, provisional application No. 63/136,204, filed on Jan. 11, 2021, provisional application No. 63/118,689, filed on Nov. 26, 2020, provisional application No. 63/118,688, filed on Nov. 26, 2020, provisional application No. 63/117,445, filed on Nov. 23, 2020.

(51) Int. Cl.

| | |
|---|---|
| ***H03H 9/02*** | (2006.01) |
| ***H03H 3/02*** | (2006.01) |
| ***H03H 9/205*** | (2006.01) |
| ***H03H 9/56*** | (2006.01) |

(52) U.S. Cl.

CPC .......... *H03H 9/02228* (2013.01); *H03H 3/02* (2013.01); *H03H 9/02015* (2013.01); *H03H 9/02086* (2013.01); *H03H 9/205* (2013.01); *H03H 9/568* (2013.01)

(58) Field of Classification Search

CPC ........... H03H 9/02; H03H 9/205; H03H 9/568

See application file for complete search history.

(56) References Cited

U.S. PATENT DOCUMENTS 5,274,345 A 12/1993 Gau
5,446,330 A 8/1995 Eda et al.

(Continued)

FOREIGN PATENT DOCUMENTS

WO 2016017104 2/2016
WO 2018003273 1/2018

OTHER PUBLICATIONS

Buchanan "Ceramic Materials for Electronics" 3rd Edition, first published in 2004 by Marcel Dekker, Inc. pp. 496 (Year 2004). Jan. 2004.

(Continued)

*Primary Examiner* — Andrea Lindgren Baltzell
*Assistant Examiner* — Alan Wong
(74) *Attorney, Agent, or Firm* — ArentFox Schiff LLP

(57) ABSTRACT

Acoustic resonators, acoustic filter devices and methods of making the same. An acoustic resonator device includes a piezoelectric plate having front and back surfaces, an inter-digital transducer (IDT) on the front surface including interleaved fingers, an overlapping distance of the inter-leaved fingers defining an aperture of the acoustic resonator device, and a modified acoustic velocity region proximate an edge of the aperture.

18 Claims, 10 Drawing Sheets

©2021 RESONANT INC.

(56) References Cited

U.S. PATENT DOCUMENTS

| | | | | |
|---|---|---|---|---|
| 5,552,655 | A | 9/1996 | Stokes et al. | |
| 5,726,610 | A | 3/1998 | Allen et al. | |
| 5,853,601 | A | 12/1998 | Krishaswamy | |
| 6,377,140 | B1 | 4/2002 | Ehara et al. | |
| 6,516,503 | B1 | 2/2003 | Ikada et al. | |
| 6,540,827 | B1 | 4/2003 | Levy et al. | |
| 6,707,229 | B1 | 3/2004 | Martin | |
| 6,710,514 | B2 | 3/2004 | Ikada et al. | |
| 7,345,400 | B2 | 3/2008 | Nakao et al. | |
| 7,463,118 | B2 | 12/2008 | Jacobsen | |
| 7,535,152 | B2 | 5/2009 | Ogami et al. | |
| 7,684,109 | B2 | 3/2010 | Godshalk et al. | |
| 7,728,483 | B2 | 6/2010 | Tanaka | |
| 7,868,519 | B2 | 1/2011 | Umeda | |
| 7,941,103 | B2 | 5/2011 | Iwamoto et al. | |
| 7,965,015 | B2 | 6/2011 | Tai et al. | |
| 7,965,155 | B2 * | 6/2011 | Nakamura | H03H 9/1452 333/195 |
| 8,278,802 | B1 | 10/2012 | Lee et al. | |
| 8,294,330 | B1 | 10/2012 | Abbott et al. | |
| 8,344,815 | B2 | 1/2013 | Yamanaka et al. | |
| 8,487,720 | B2 * | 7/2013 | Fujiwara | H03H 9/64 310/313 C |
| 8,816,567 | B2 | 8/2014 | Zuo et al. | |
| 8,829,766 | B2 | 9/2014 | Milyutin et al. | |
| 8,932,686 | B2 | 1/2015 | Hayakawa et al. | |
| 9,035,725 | B2 * | 5/2015 | Komatsu | H03H 9/02858 333/193 |
| 9,093,979 | B2 | 7/2015 | Wang | |
| 9,112,134 | B2 | 8/2015 | Takahashi | |
| 9,130,145 | B2 | 9/2015 | Martin et al. | |
| 9,219,466 | B2 | 12/2015 | Meltaus et al. | |
| 9,276,557 | B1 | 3/2016 | Nordquist et al. | |
| 9,369,105 | B1 | 6/2016 | Li et al. | |
| 9,425,765 | B2 | 8/2016 | Rinaldi | |
| 9,525,398 | B1 | 12/2016 | Olsson | |
| 9,640,750 | B2 * | 5/2017 | Nakanishi | H03H 9/02834 |
| 9,748,923 | B2 | 8/2017 | Kando et al. | |
| 9,762,202 | B2 | 9/2017 | Thalmayr et al. | |
| 9,780,759 | B2 | 10/2017 | Kimura et al. | |
| 9,837,984 | B2 | 12/2017 | Khlat et al. | |
| 10,079,414 | B2 | 9/2018 | Guyette et al. | |
| 10,187,039 | B2 | 1/2019 | Komatsu et al. | |
| 10,200,013 | B2 | 2/2019 | Bower et al. | |
| 10,211,806 | B2 | 2/2019 | Bhattacharjee | |
| 10,270,424 | B2 * | 4/2019 | Matsukura | H03H 9/6489 |
| 10,284,176 | B1 | 5/2019 | Solal | |
| 10,491,192 | B1 | 11/2019 | Plesski et al. | |
| 10,601,392 | B2 | 3/2020 | Plesski et al. | |
| 10,637,438 | B2 | 4/2020 | Garcia et al. | |
| 10,644,674 | B2 | 5/2020 | Takamine | |
| 10,756,697 | B2 | 8/2020 | Plesski et al. | |
| 10,790,802 | B2 | 9/2020 | Yantchev et al. | |
| 10,797,675 | B2 | 10/2020 | Plesski | |
| 10,819,309 | B1 | 10/2020 | Turner et al. | |
| 10,826,462 | B2 | 11/2020 | Plesski et al. | |
| 10,868,510 | B2 | 12/2020 | Yantchev et al. | |
| 10,868,512 | B2 | 12/2020 | Garcia et al. | |
| 10,868,513 | B2 | 12/2020 | Yantchev | |
| 10,911,017 | B2 | 2/2021 | Plesski | |
| 10,911,021 | B2 | 2/2021 | Turner et al. | |
| 10,911,023 | B2 | 2/2021 | Turner | |
| 10,917,070 | B2 | 2/2021 | Plesski et al. | |
| 10,917,072 | B2 | 2/2021 | McHugh et al. | |
| 10,985,726 | B2 | 4/2021 | Plesski | |
| 10,985,728 | B2 | 4/2021 | Plesski et al. | |
| 10,985,730 | B2 | 4/2021 | Garcia | |
| 10,992,282 | B1 | 4/2021 | Plesski et al. | |
| 10,992,283 | B2 | 4/2021 | Plesski et al. | |
| 10,992,284 | B2 | 4/2021 | Yantchev | |
| 10,998,877 | B2 | 5/2021 | Turner et al. | |
| 10,998,882 | B2 | 5/2021 | Yantchev et al. | |
| 11,003,971 | B2 | 5/2021 | Plesski et al. | |
| 11,133,790 | B2 * | 9/2021 | Daimon | H03H 9/02866 |
| 11,239,817 | B2 * | 2/2022 | Hatano | H03H 9/1452 |
| 11,444,599 | B2 * | 9/2022 | Sasaki | H03H 9/13 |
| 11,621,687 | B2 * | 4/2023 | Daimon | H03H 9/0009 310/313 R |
| 11,811,392 | B2 * | 11/2023 | Hiramatsu | H03H 9/6483 |
| 2002/0079986 | A1 | 6/2002 | Ruby et al. | |
| 2002/0130736 | A1 | 9/2002 | Mukai | |
| 2002/0158714 | A1 | 10/2002 | Kaitila et al. | |
| 2002/0189062 | A1 | 12/2002 | Lin et al. | |
| 2003/0080831 | A1 | 5/2003 | Naumenko et al. | |
| 2003/0199105 | A1 | 10/2003 | Kub et al. | |
| 2004/0100164 | A1 | 5/2004 | Murata | |
| 2004/0261250 | A1 | 12/2004 | Kadota et al. | |
| 2005/0185026 | A1 | 8/2005 | Noguchi et al. | |
| 2005/0218488 | A1 | 10/2005 | Matsuo | |
| 2005/0264136 | A1 | 12/2005 | Tsutsumi et al. | |
| 2006/0179642 | A1 | 8/2006 | Kawamura | |
| 2007/0182510 | A1 | 8/2007 | Park | |
| 2007/0188047 | A1 | 8/2007 | Tanaka | |
| 2007/0194863 | A1 | 8/2007 | Shibata et al. | |
| 2007/0267942 | A1 | 11/2007 | Matsumoto et al. | |
| 2008/0246559 | A1 | 10/2008 | Ayazi | |
| 2010/0064492 | A1 | 3/2010 | Tanaka | |
| 2010/0123367 | A1 | 5/2010 | Tai et al. | |
| 2011/0018389 | A1 | 1/2011 | Fukano et al. | |
| 2011/0018654 | A1 | 1/2011 | Bradley et al. | |
| 2011/0109196 | A1 | 5/2011 | Goto et al. | |
| 2011/0278993 | A1 | 11/2011 | Iwamoto | |
| 2012/0286900 | A1 | 11/2012 | Kadota et al. | |
| 2013/0234805 | A1 | 9/2013 | Takahashi | |
| 2013/0271238 | A1 | 10/2013 | Onda | |
| 2013/0278609 | A1 | 10/2013 | Stephanou et al. | |
| 2013/0321100 | A1 | 12/2013 | Wang | |
| 2014/0130319 | A1 | 5/2014 | Iwamoto | |
| 2014/0145556 | A1 | 5/2014 | Kadota | |
| 2014/0151151 | A1 | 6/2014 | Reinhardt | |
| 2014/0152145 | A1 | 6/2014 | Kando et al. | |
| 2014/0173862 | A1 | 6/2014 | Kando et al. | |
| 2014/0225684 | A1 | 8/2014 | Kando et al. | |
| 2015/0042417 | A1 | 2/2015 | Onodera et al. | |
| 2015/0165479 | A1 | 6/2015 | Lasiter et al. | |
| 2015/0319537 | A1 | 11/2015 | Perois et al. | |
| 2015/0333730 | A1 | 11/2015 | Meltaus et al. | |
| 2016/0028367 | A1 | 1/2016 | Shealy | |
| 2016/0182009 | A1 | 6/2016 | Bhattacharjee | |
| 2017/0063332 | A1 | 3/2017 | Gilbert et al. | |
| 2017/0179225 | A1 | 6/2017 | Kishimoto | |
| 2017/0179928 | A1 | 6/2017 | Raihn et al. | |
| 2017/0214381 | A1 | 7/2017 | Bhattacharjee | |
| 2017/0214387 | A1 | 7/2017 | Burak et al. | |
| 2017/0222617 | A1 | 8/2017 | Mizoguchi | |
| 2017/0222622 | A1 | 8/2017 | Solal et al. | |
| 2017/0370791 | A1 | 12/2017 | Nakamura et al. | |
| 2018/0005950 | A1 | 1/2018 | Watanabe | |
| 2018/0026603 | A1 | 1/2018 | Iwamoto | |
| 2018/0033952 | A1 | 2/2018 | Yamamoto | |
| 2018/0041191 | A1 | 2/2018 | Park | |
| 2018/0062615 | A1 | 3/2018 | Kato et al. | |
| 2018/0062617 | A1 | 3/2018 | Yun et al. | |
| 2018/0123016 | A1 | 5/2018 | Gong | |
| 2018/0191322 | A1 | 7/2018 | Chang et al. | |
| 2018/0278227 | A1 | 9/2018 | Hurwitz | |
| 2019/0068164 | A1 | 2/2019 | Houlden et al. | |
| 2019/0123721 | A1 | 4/2019 | Takamine | |
| 2019/0131953 | A1 | 5/2019 | Gong | |
| 2019/0273480 | A1 | 9/2019 | Lin et al. | |
| 2019/0348966 | A1 | 11/2019 | Campanella-Pineda | |
| 2019/0386636 | A1 | 12/2019 | Plesski et al. | |
| 2020/0036357 | A1 | 1/2020 | Mimura | |
| 2020/0235719 | A1 | 7/2020 | Yantchev et al. | |
| 2020/0259480 | A1 | 8/2020 | Pensala | |
| 2020/0313645 | A1 | 10/2020 | Caron | |
| 2020/0350891 | A1 | 11/2020 | Turner | |
| 2021/0013859 | A1 | 1/2021 | Turner et al. | |

OTHER PUBLICATIONS

Sorokin et al. Study of Microwave Acoustic Attenuation in a Multi-frequency Bulk Acoustic Resonator Based on a Synthetic

(56) References Cited

OTHER PUBLICATIONS

Diamond Single Crystal Published in Acoustical Physics, vol. 61, No. 6, 2015 pp. 675 (Year 2015) Jan. 2015.
Zou, Jie "High-Performance Aluminum Nitride Lamb Wave Resonators for RF Front-End Technology" University of California, Berkeley, Summer 2015, pp. 63 (Year 2015) Jan. 2015.
Santosh, G. , Surface acoustic wave devices on silicon using patterned and thin film ZnO, Ph.D. thesis, Feb. 2016, Indian Institute of technology Guwahati, Assam, India Feb. 2016.
Merriam Webster, dictionary meaning of the word "diaphragm", since 1828, Merriam Webster (Year: 1828) 1828.
Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.
Safari et al. "Piezoelectric for Transducer Applications" published by Elsevier Science Ltd., pp. 4 (Year: 2000). 2020.
Moussa et al. Review on Triggered Liposomal Drug Delivery with a Focus on Ultrasound 2015, Bentham Science Publishers, pp. 16 (Year 2005) 2005.
Acoustic Properties of Solids ONDA Corporation 592 Weddell Drive, Sunnyvale, CA 94089, Apr. 11, 2003, pp. 5 (Year 2003). 2003.
Bahreyni, B. Fabrication and Design of Resonant Microdevices Andrew William, Inc. 2018, NY (Year 2008). 2008.
Material Properties of Tibtech Innovations, © 2018 Tibtech Innovations (Year 2018). 2018.
USPTO/ISA, International Search Report and Written Opinion for PCT Application No. PCT/US2020/45654 dated Oct. 29, 2020.
T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.
R. Olsson III, K. Hattar et al. "A high electromechanical coupling coefficient SHO Lamb wave lithiumniobate micromechanical resonator and a method for fabrication" Sensors and Actuators A: Physical, vol. 209, Mar. 1, 2014, pp. 183-190.
M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.
Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.
Y. Yang, A. Gao et al. "5 GHZ Lithium Niobate MEMS Resonators With High FOM of 153", 2017 IEEE 30th International Conference in Micro Electro Mechanical Systems (MEMS). Jan. 22-26, 2017. pp. 942-945.
USPTO/ISA, International Search Report and Written Opinion for PCT Application No. PCT/US2019/036433 dated Aug. 29, 2019.
USPTO/ISA, International Search Report and Written Opinion for PCT Application No. PCT/US2019/058632 dated Jan. 17, 2020.
G. Manohar, "Investigation of Various Surface Acoustic Wave Design Configurations for Improved Sensitivity." Doctoral dissertation, University of South Florida, USA, Jan. 2012, 7 pages.
Ekeom, D. & Dubus, Bertrand & Volatier, A . . . (2006). Solidly mounted resonator (SMR) FEM-BEM simulation. 1474-1477. 10.1109/ULTSYM.2006.371.
Mizutaui, K. and Toda, K., "Analysis of lamb wave propagation characteristics in rotated Ycut Xpropagation LiNbO3 plates." Electron. Comm. Jpn. Pt. I, 69, No. 4 (1986): 47-55. doi:10.1002/ecja.4410690406.
Naumenko et al., "Optimal orientations of Lithium Niobate for resonator SAW filters", 2003 IEEE Ultrasonics Symposium—pp. 2110-2113. (Year: 2003).
Namdeo et al. "Simulation on Effects of Electrical Loading due to Interdigital Transducers in Surface Acoustic Wave Resonator", published in Procedia Engineering 64 ( 2013) of Science Direct pp. 322-330 (Year: 2013) 2013.
Rodriguez-Madrid et al., "Super-High-Frequency SAW Resonators on AlN/Diamond", IEEE Electron Device Letters, vol. 33, No. 4, Apr. 2012, pp. 495-497. Year: 2012) 2012.
A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.
Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.
Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.
USPTO/ISA, International Search Report and Written Opinion for PCT Application No. PCT/US2021/024824 dated Jul. 27, 2021, 9 total pages.

* cited by examiner

©2021 RESONANT INC

©2021 RESONANT INC.

©2021 RESONANT INC.

©2021 RESONANT INC.

©2021 RESONANT INC.

©2021 RESONANT INC.

©2021 RESONANT INC.

©2021 RESONANT INC.

Notes: Only one of actions 810A, 810B, 810C is performed in each of three variations of the process 800.

©2021 RESONANT INC.

TRANSVERSELY-EXCITED FILM BULK ACOUSTIC RESONATORS WITH IMPROVED EDGE EFFECTS

RELATED APPLICATION INFORMATION

This patent claims priority to provisional patent application No. 63/117,445, filed Nov. 23, 2020, entitled XBAR WITH IMPROVED EDGE EFFECTS, which is incorporated herein by reference. The patent is also a continuation-in-part of application Ser. No. 17/490,168, filed Sep. 30, 2021, entitled TRANSVERSELY-EXCITED FILM BULK ACOUSTIC RESONATORS WITH STRUCTURES TO REDUCE ACOUSTIC ENERGY LEAKAGE, which claims priority to provisional patent application Nos. 63/118,688, filed Nov. 26, 2020 entitled STRUCTURES FOR SUPPRESSION OF ELECTRODE END EFFECTS; provisional patent application No. 63/118,689, filed Nov. 26, 2020 entitled STRUCTURES WITH DUMMY FINGERS FOR SUPPRESSION OF ELECTRODE END EFFECTS; provisional patent application No. 63/136,203, filed Jan. 11, 2021 entitled PISTON MODE XBAR ON Z-CUT LITHIUM NIOBATE; and provisional patent application No. 63/136,204, filed Jan. 11, 2021 entitled PISTON MODE XBAR ON ROTATED Y-CUT LITHIUM NIOBATE, the entire contents of all of which are incorporated herein by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where “pass” means transmit with relatively low signal loss and “stop” means block or substantially attenuate. The range of frequencies passed by a filter is referred to as the “pass-band” of the filter. The range of frequencies stopped by such a filter is referred to as the “stop-band” of the filter. A typical RF filter has at least one pass-band and at least one stop-band. Specific requirements on a pass-band or stop-band depend on the application. For example, a “pass-band” may be defined as a frequency range where the insertion loss of a filter is better than a defined value such as 1 dB, 2 dB, or 3 dB. A “stop-band” may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation (5G) mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in patent U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
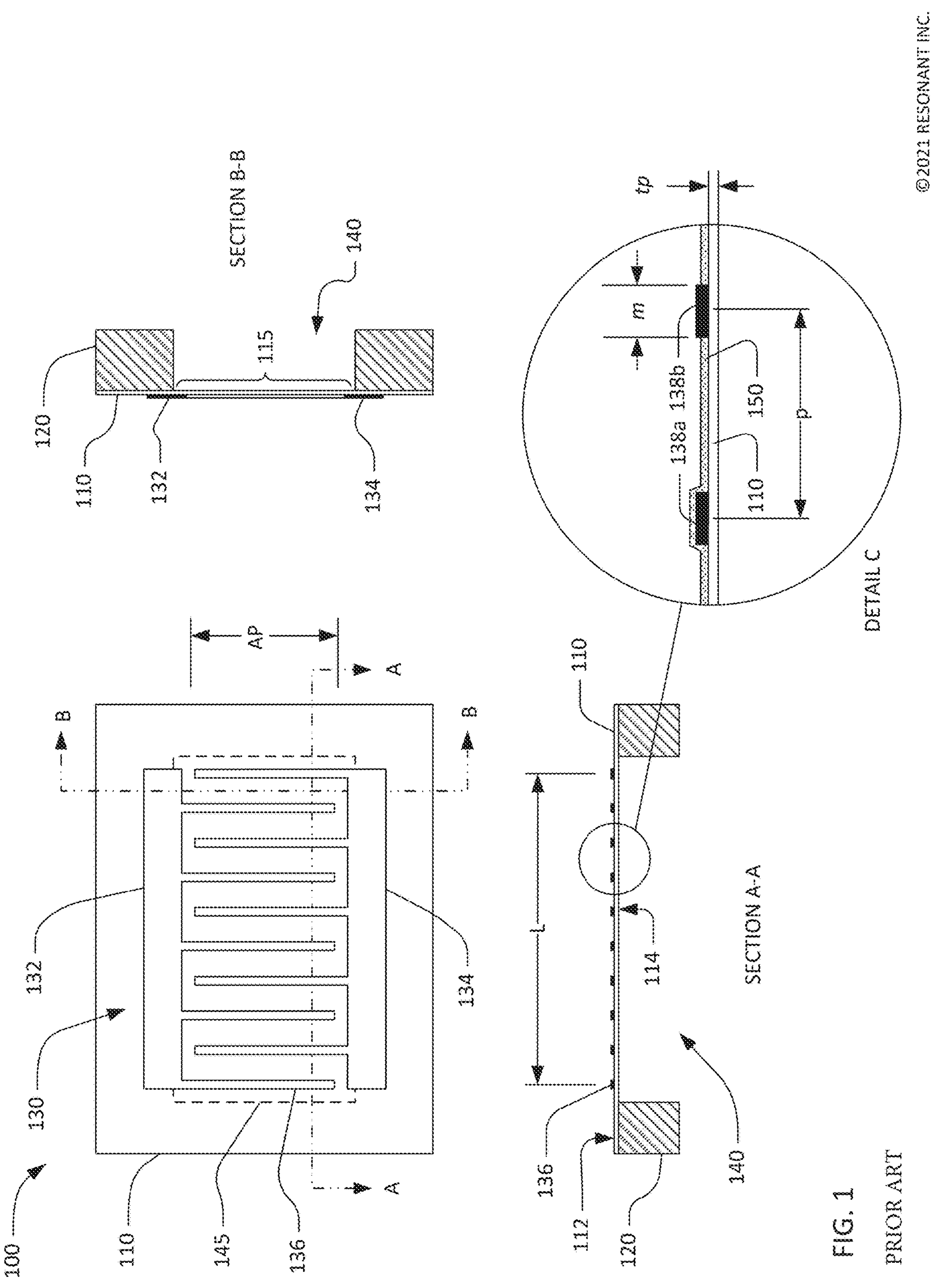
FIG. 1 PRIOR ART
FIG. 1 includes a schematic plan view, two schematic cross-sectional views, and a detail view of a transversely-excited film bulk acoustic resonator (XBAR).

FIG. 1 shows a simplified schematic top view and orthogonal cross-sectional views of an XBAR 100. XBAR-type resonators such as the XBAR 100 may be used in a variety of RF filters including band-reject filters, band-pass filters, duplexers, and multiplexers.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. The piezoelectric plate may be Z-cut, which is to say the Z axis is normal to the front and back surfaces 112, 114. The piezoelectric plate may be ZY-cut, rotated Y-cut, rotated Z-cut or rotated YX-cut. XBARs may be fabricated on piezoelectric plates with other crystallographic orientations.

The back surface 114 of the piezoelectric plate 110 is attached to a surface of a substrate 120 except for a portion of the piezoelectric plate 110 that forms a diaphragm 115 spanning a cavity 140 formed in the substrate. The portion of the piezoelectric plate that spans the cavity is referred to herein as the "diaphragm" 115 due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item". In other configurations, the diaphragm 115 may be contiguous with the piezoelectric plate around at least 50% of the perimeter 145 of the cavity 140.

The substrate 120 provides mechanical support to the piezoelectric plate 110. The substrate 120 may be, for example, silicon, sapphire, quartz, or some other material or combination of materials. The back surface 114 of the piezoelectric plate 110 may be attached to the substrate 120 using a wafer bonding process. Alternatively, the piezoelectric plate 110 may be grown on the substrate 120 or attached to the substrate in some other manner. The piezoelectric plate 110 may be attached directly to the substrate or may be attached to the substrate 120 via one or more intermediate material layers (not shown in FIG. 1).

"Cavity" has its conventional meaning of "an empty space within a solid body." The cavity 140 may be a hole completely through the substrate 120 (as shown in Section A-A and Section B-B) or a recess in the substrate 120 under the diaphragm 115. The cavity 140 may be formed, for example, by selective etching of the substrate 120 before or after the piezoelectric plate 110 and the substrate 120 are attached.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The term "busbar" means a conductor from which the fingers of an IDT extend. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. The primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned on the piezoelectric plate 110 such that at least the fingers of the IDT 130 are disposed on the diaphragm 115 that spans, or is suspended over, the cavity 140. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may be more or fewer than four sides, which may be straight or curved.

For ease of presentation in FIG. 1, the geometric pitch and width of the IDT fingers are greatly exaggerated with respect to the length (dimension L) and aperture (dimension AP) of the XBAR. A typical XBAR has more than ten parallel fingers in the IDT 130. An XBAR may have hundreds, possibly thousands, of parallel fingers in the IDT 130. Similarly, the thicknesses of the IDT fingers and the piezoelectric plate in the cross-sectional views are greatly exaggerated.

Referring now to the detailed schematic cross-sectional view (Detail C), a front-side dielectric layer 150 (or coating) may optionally be formed on the front side of the piezoelectric plate 110. The "front side" of the XBAR is, by definition, the surface facing away from the substrate. The front-side dielectric layer 150 may be formed only between the IDT fingers (e.g. IDT finger 138*b*) or may be deposited as a blanket layer such that the dielectric layer is formed both between and over the IDT fingers (e.g. IDT finger 138*a*). The front-side dielectric layer 150 may be a non-piezoelectric dielectric material, such as silicon dioxide, alumina, or silicon nitride. A thickness of the front side dielectric layer 150 is typically less than about one-third of the thickness tp of the piezoelectric plate 110. The front-side dielectric layer 150 may be formed of multiple layers of two or more materials. In some applications, a back-side dielectric layer (not shown) may be formed on the back side of the piezoelectric plate 110.

The IDT fingers 138*a*, 138*b* may be one or more layers of aluminum, an aluminum alloy, copper, a copper alloy, beryllium, gold, tungsten, molybdenum, chromium, titanium or some other conductive material. The IDT fingers are considered to be "substantially aluminum" if they are formed from aluminum or an alloy comprising at least 50% aluminum. The IDT fingers are considered to be "substantially copper" if they are formed from copper or an alloy comprising at least 50% copper. Thin (relative to the total thickness of the conductors) layers of metals such as chromium or titanium may be formed under and/or over and/or as layers within the fingers to improve adhesion between the fingers and the piezoelectric plate 110 and/or to passivate or encapsulate the fingers and/or to improve power handling. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. Dimension m is the width or "mark" of the IDT fingers. The geometry of the IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT may be 2 to 20 times the width m of the fingers. The pitch p is typically 3.3 to 5 times the width m of the fingers. In addition, the pitch p of the IDT may be 2 to 20 times the thickness of the piezoelectric plate 210. The pitch p of the IDT is typically 5 to 12.5 times the thickness of the piezoelectric plate 210. The width m of the IDT fingers in an XBAR is not constrained to be near one-fourth of the acoustic wavelength at resonance. For example, the width of XBAR IDT fingers may be 500 nm or greater, such that the IDT can be readily fabricated using optical lithography. The thickness of the IDT fingers may be from 100 nm to about equal to the width m. The thickness of the busbars (132, 134) of the IDT may be the same as, or greater than, the thickness of the IDT fingers.

Figure 2:
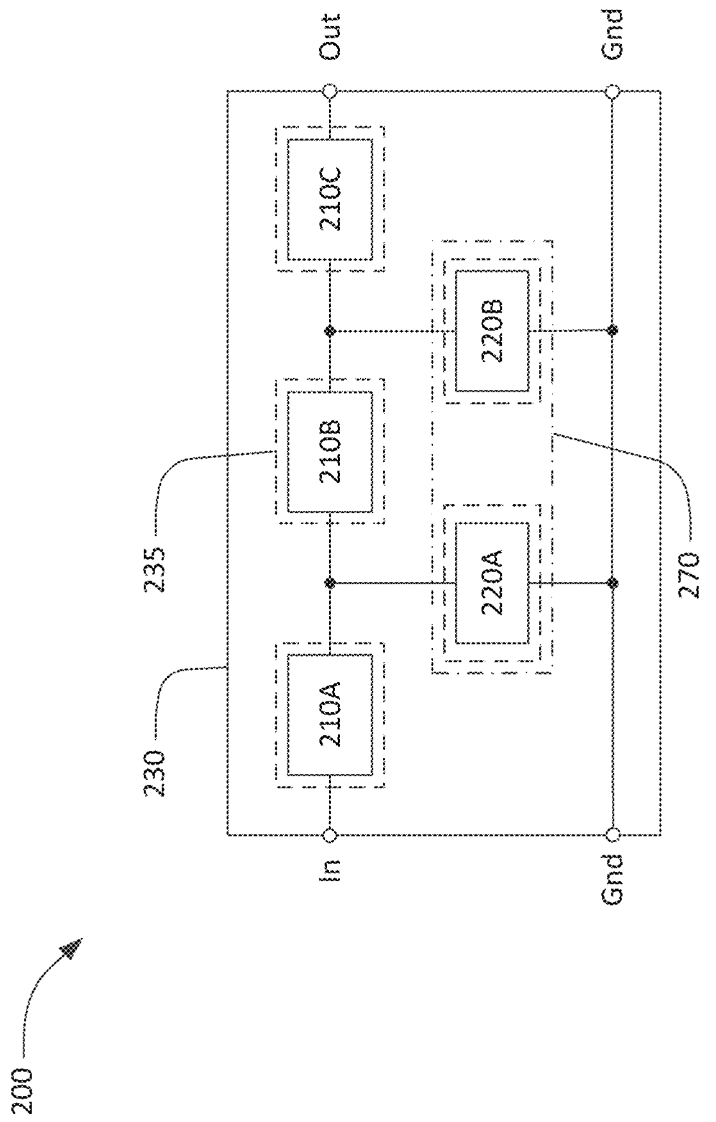
FIG. 2 PRIOR ART
FIG. 2 is a schematic block diagram of a band-pass filter using acoustic resonators.

FIG. 2 is a schematic circuit diagram and layout for a high frequency band-pass filter 200 using XBARs. The filter 200 has a conventional ladder filter architecture including three series resonators 210A, 210B, 210C and two shunt resonators 220A, 220B. The three series resonators 210A, 210B, and 210C are connected in series between a first port and a second port (hence the term "series resonator"). In FIG. 2, the first and second ports are labeled "In" and "Out", respectively. However, the filter 200 is bidirectional and either port may serve as the input or output of the filter. The two shunt resonators 220A, 220B are connected from nodes between the series resonators to ground. A filter may contain additional reactive components, such as capacitors and/or inductors, not shown in FIG. 2. All the shunt resonators and series resonators are XBARs. The inclusion of three series and two shunt resonators is exemplary. A filter may have more or fewer than five total resonators, more or fewer than three series resonators, and more or fewer than two shunt resonators. Typically, all of the series resonators are connected in series between an input and an output of the filter. All of the shunt resonators are typically connected between ground and one of the input, the output, or a node between two series resonators.

In the exemplary filter 200, the three series resonators 210A, 210B, and 210C and the two shunt resonators 220A and 210B of the filter 200 are formed on a single plate 230 of piezoelectric material bonded to a silicon substrate (not visible). In some filters, the series resonators and shunt resonators may be formed on different plates of piezoelectric material. Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 2, the cavities are illustrated schematically as the dashed rectangles (such as the rectangle 235). In this example, each IDT is disposed over a respective cavity. In other filters, the IDTs of two or more resonators may be disposed over a single cavity.

Each of the resonators 210A, 210B, 210C, 220A, and 220B in the filter 200 has resonance where the admittance of the resonator is very high and an anti-resonance where the admittance of the resonator is very low. The resonance and anti-resonance occur at a resonance frequency and an anti-resonance frequency, respectively, which may be the same or different for the various resonators in the filter 200. In over-simplified terms, each resonator can be considered a short-circuit at its resonance frequency and an open circuit at its anti-resonance frequency. The input-output transfer function will be near zero at the resonance frequencies of the shunt resonators and at the anti-resonance frequencies of the series resonators. In a typical filter, the resonance frequencies of the shunt resonators are positioned below the lower edge of the filter's passband and the anti-resonance frequencies of the series resonators are positioned above the upper edge of the passband. In some filters, a dielectric layer (also called a "frequency setting layer"), represented by the dot-dash rectangle 270, may be formed on the front and/or back surface of the shunt resonators to set the resonance frequencies of the shunt resonators lower relative to the resonance frequencies of the series resonators. In other filters, the diaphragms of series resonators may be thinner than the diaphragms of shunt resonators. In some filters, the series resonators and the shunt resonators may be fabricated on separate chips having different piezoelectric plate thicknesses.

Three-dimensional simulations of XBAR devices show some acoustic energy may leak or be lost at the ends of the IDT fingers. A well-guided wave exhibits high order waveguide modes formed along the aperture. The transverse modes of the acoustic wave couple to the gap and can form energy confinement inside the gap. This appears either as a loss or strong spurs. Coupling to various transverse modes is possible because of the non-orthogonality between the uniform electric field along aperture and the transverse modes pattern. These transverse modes should be decoupled electrically by the IDT to suppress spurious modes.

A resonator with low loss and low spur content can be designed by improving waveguiding (e.g., suppressing wave radiation between the IDT ends and the busbar), while electrically decoupling the higher order transverse modes. The decoupling is usually performed through a "piston" design, where the fundamental transversal mode at resonance has uniform distribution along the aperture. Thus, the fundamental transverse mode pattern coincides with the external electric field pattern. In waveguide theory, waveguided modes are functionally orthogonal, thus all higher order modes are orthogonal to the fundamental mode pattern, which is the same as external electric field in piston mode. As a result, higher order transverse modes are electrically decoupled from the IDT.

Figure 3A:
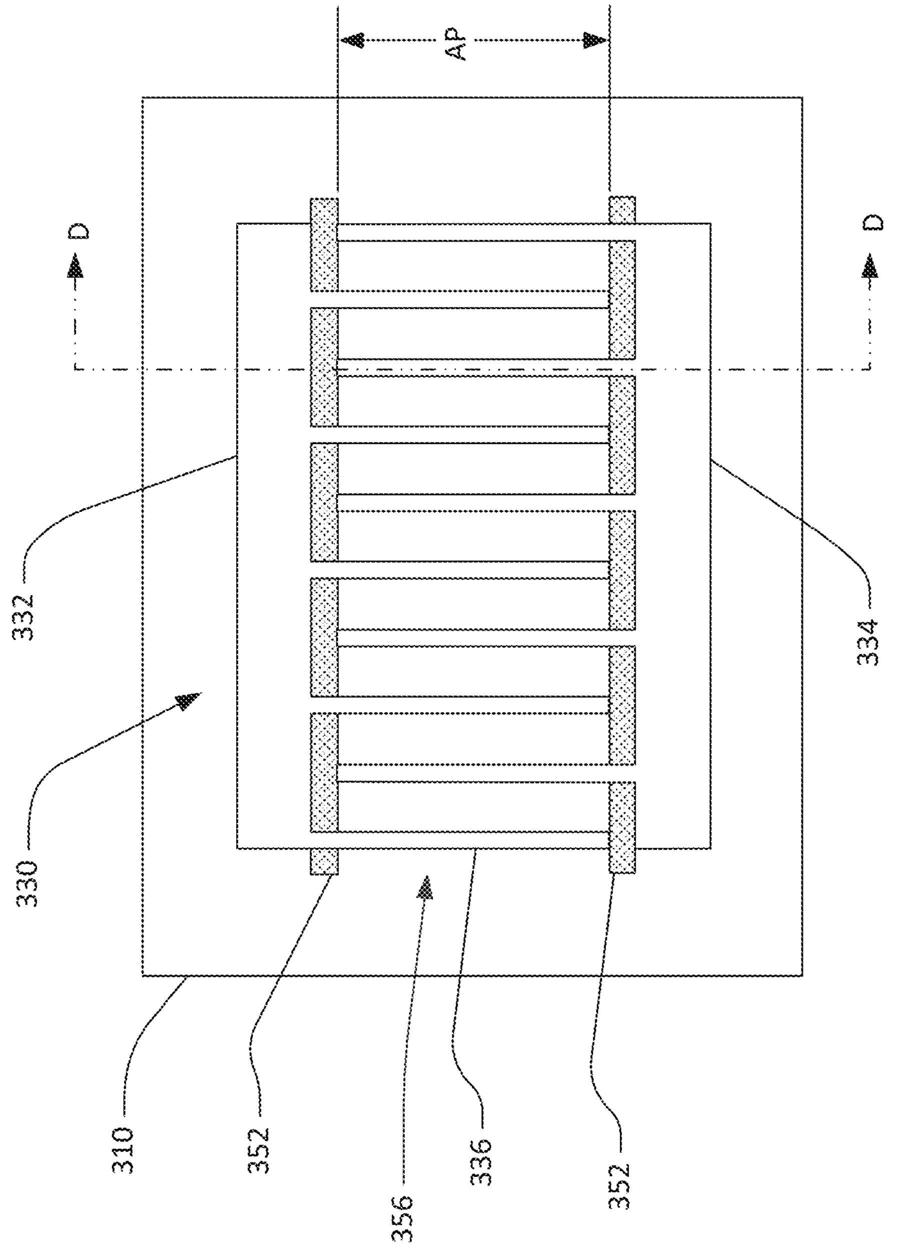
FIG. 3A is a schematic plan view of an XBAR with a modified acoustic velocity region.
Figure 3B:
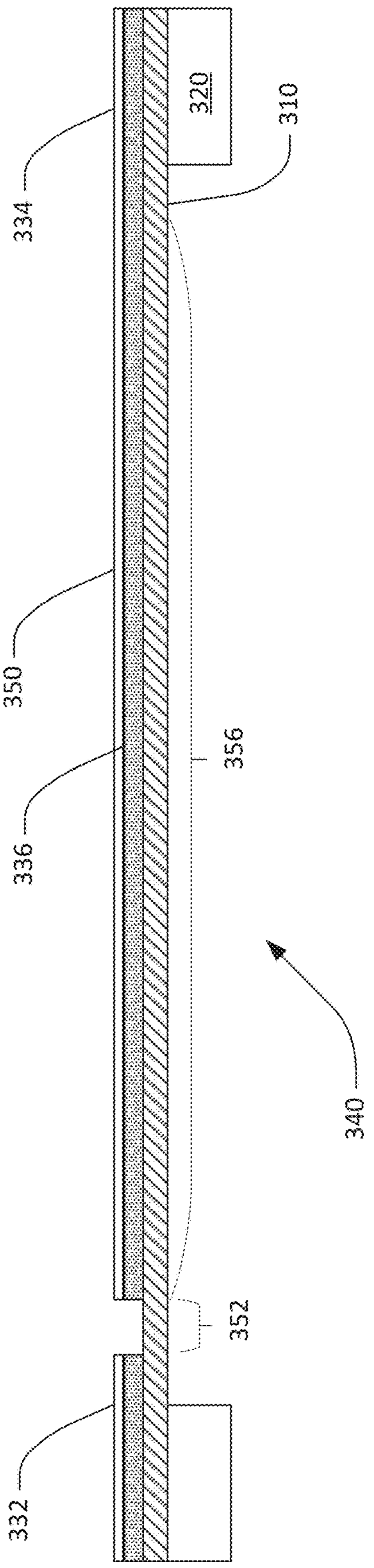
FIG. 3B is a cross-sectional view of the XBAR of FIG. 3A.

FIG. 3A is a schematic plan view of an XBAR 300 with a modified acoustic velocity region to reduce acoustic energy leakage. FIG. 3B is a cross-sectional view of the XBAR of FIG. 3A through Section D-D. Similar to the XBAR 100 of FIG. 1, XBAR 300 includes a piezoelectric plate 310 on a substrate 320 with a cavity 340, and an IDT 330 having interleaved fingers 336 extending from busbars 332, 334 on the piezoelectric plate 310. A frontside dielectric layer 350 is over the IDT. The interleaved fingers overlap for a distance AP, referred to as the "aperture" of the IDT.

The XBAR 300 also includes a modified acoustic velocity region 352 proximate the busbars 332, 334. As shown in FIG. 3B, the frontside dielectric layer is removed or not formed on a modified acoustic velocity region 352 between the ends of the interleaved fingers 336 and a busbar 332, 334. A resonance frequency of the primary shear acoustic mode excited by the IDT 330 in the modified acoustic velocity region 352 has a higher frequency than the primary shear acoustic mode excited by the IDT 330 in the piezoelectric plate 310 within a central portion 356 of the aperture. The frequency is higher in the thinner modified acoustic velocity region 352 because frequency is approximately inversely proportional to device thickness. This results in reduced energy leakage from the ends of the fingers because improved waveguiding is achieved.

In one example, the modified acoustic velocity region has a length (in a direction along the fingers 336) of 5 μm. In other examples, the modified acoustic velocity region can have a length in a range from about p to about 3p.

Figure 4A:
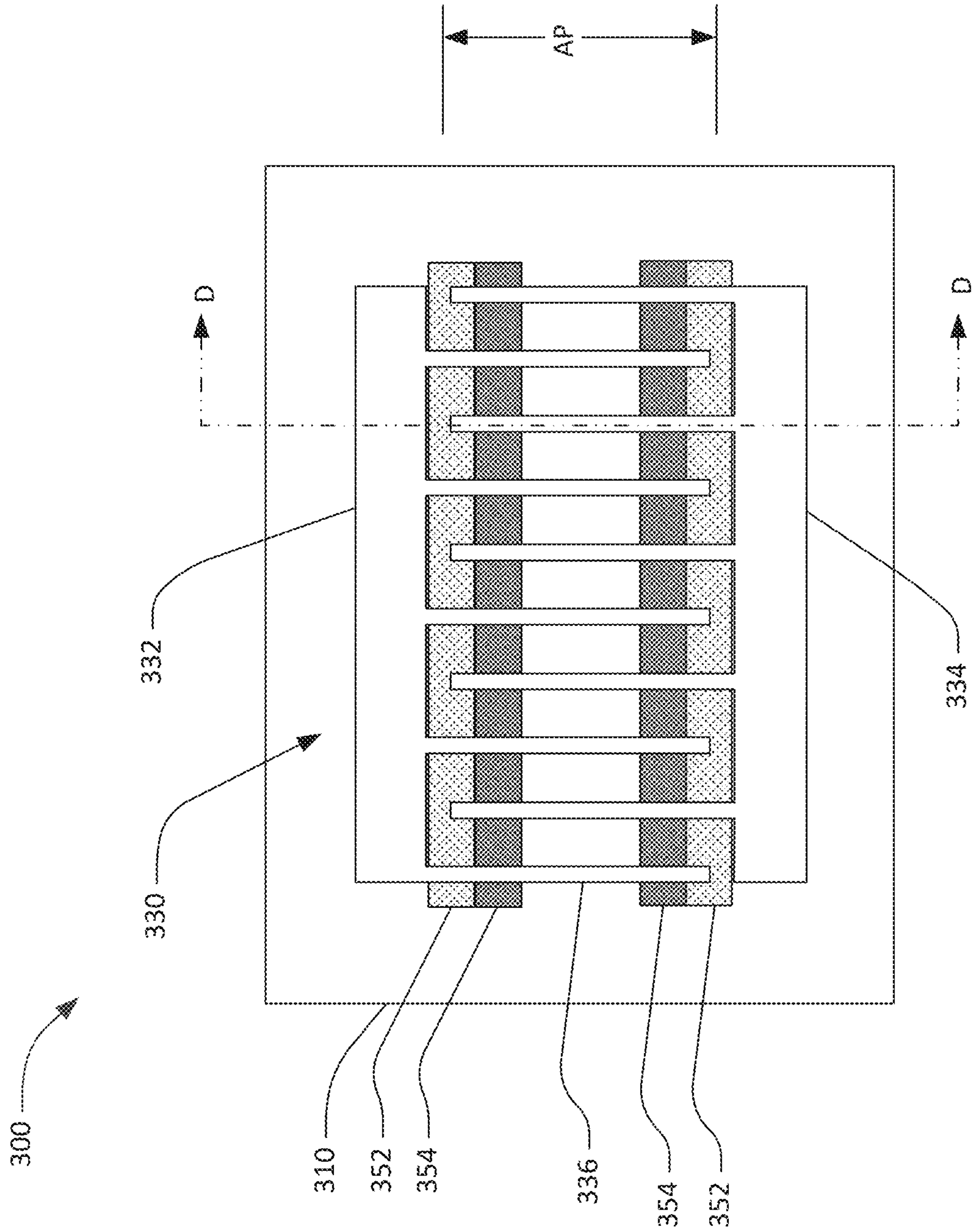
FIG. 4A is a schematic plan view of an XBAR with structures to reduce acoustic energy leakage in another exemplary aspect.
Figure 4B:
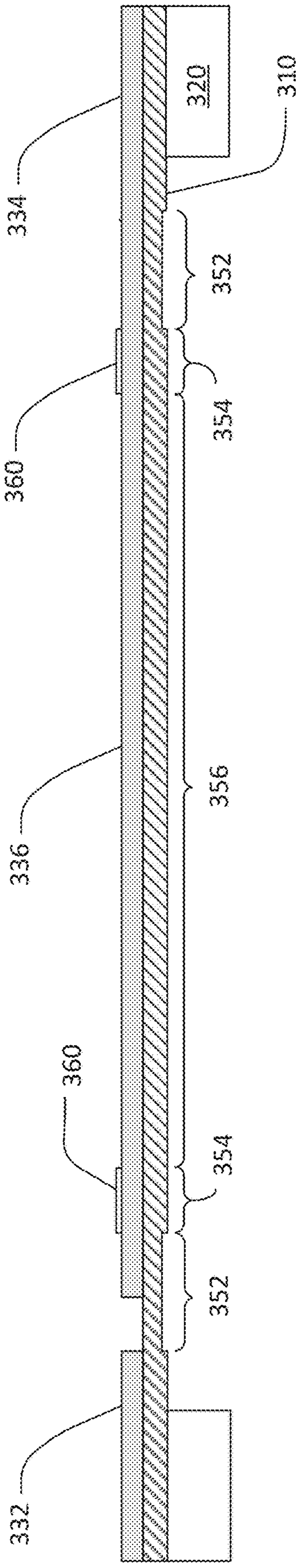
FIG. 4B is a cross-sectional view of the XBAR of FIG. 4A.

FIG. 4A is a schematic plan view of an XBAR 300 with structures to reduce acoustic energy leakage according to another exemplary aspect. FIG. 4B is a cross-sectional view of the XBAR of FIG. 4A through Section D-D. Similar to the XBAR 100 of FIG. 1, XBAR 300 includes a piezoelectric plate 310 on a substrate 320 with a cavity 345, and an IDT 330 having interleaved fingers 336 extending from busbars 332, 334 on the piezoelectric plate 310. The interleaved fingers overlap for a distance AP, referred to as the "aperture" of the IDT.

The XBAR 300 also includes a fast region 352 proximate the busbars 332, 334. As shown in FIG. 4B, the piezoelectric plate 310 is thinner in the fast region 352 than the piezoelectric plate 310 in a central portion 356 of the aperture. A resonance frequency of the primary shear acoustic mode excited by the IDT 330 in the piezoelectric plate 310 in the fast region 352 has a higher frequency than the primary shear acoustic mode excited by the IDT 330 in the piezoelectric plate 310 within the central portion 356 of the aperture. In one example, the resonance frequency in the fast region 352 is greater than or equal to the anti-resonance frequency of the central portion 356. The frequency is higher in the thinner fast region 352 because frequency is approximately inversely proportional to diaphragm thickness. This results in reduced energy leakage from the ends of the fingers because improved waveguiding is achieved.

In one example, the piezoelectric plate has a thickness of 350 nm in the central portion, and the piezoelectric plate has a thickness of 310 nm in the fast region.

The XBAR 300 also includes a slow region 354 adjacent the fast region 352 and proximate an edge of the aperture. As shown in FIG. 4B, in the slow region 354, a strip 360 of dielectric material (e.g., $SiO_2$) is on the piezoelectric plate 310 such that the strip 360 is over a portion of the fingers 336 in the slow region 354. The primary shear acoustic mode excited by the IDT 330 in the piezoelectric plate 310 in the slow region 354 has a lower frequency than the primary shear acoustic mode excited by the IDT 330 in the piezoelectric plate 310 within the central portion 356 of the aperture. The frequency is lower in the thicker slow region 354 because frequency is approximately inversely proportional to diaphragm thickness. This results in reduced energy leakage from the ends of the fingers because improved waveguiding is achieved.

Figure 4C:
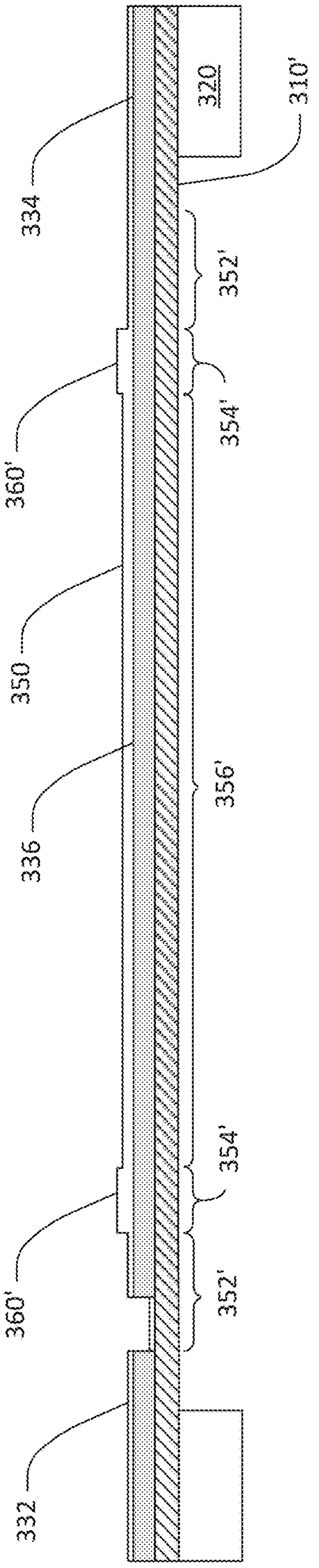
FIG. 4C is an alternative cross-sectional view of the XBAR of FIG. 4A.

FIG. 4C is an alternative cross-sectional view of the XBAR of FIG. 4A through Section D-D. XBAR 300' has a frontside dielectric layer 350 on the piezoelectric plate 310 over the IDT 330. The XBAR 300' also includes a fast region 352' proximate the busbars 332, 334. In the fast region 352', the frontside dielectric layer 350 is thinner than the frontside dielectric layer 350 in a central portion 356'. The XBAR 300' also includes a slow region 354' adjacent the fast region 352' and proximate an edge of the aperture. As shown in FIG. 4C, in the slow region 354', an additional strip 360' of dielectric material (e.g., $SiO_2$) is on the piezoelectric plate 310 such that the strip 360' is over a portion of the fingers 336 in the slow region 354'.

Alternatively, a thickness of the piezoelectric plate, a thickness of the dielectric layer and/or a thickness of the interleaved fingers can be less in the fast region than in the central portion of the aperture to achieve the higher frequency. In another example, the mark of the IDT can be wider in the fast region than the central portion to achieve the higher frequency. Further, a thickness of the piezoelectric plate, a thickness of the dielectric layer, and a thickness of the interleaved fingers can be greater in the slow region than in the central portion of the aperture to achieve the lower frequency. In another example, the mark of the IDT can be narrower in the slow region than the central portion to achieve the lower frequency. To achieve desired performance of the device, the thicknesses of all of the layers (i.e., the piezoelectric plate, the dielectric layer, and the IDT fingers) of the device can be optimized in the fast region, slow region, and central portion according the resonance frequencies and the materials forming the layers. Further, the lengths (in a direction along the fingers) of the fast region and slow region can be optimized to achieve desired importance.

In other examples, the fast region can either extend under the busbars, start at an edge of the busbars, or be positioned within a gap between the busbars and the fast region. The fast region may or may not extend under the ends of the alternating fingers extending from the opposite busbar. The slow region can be directly adjacent to the fast region, or there may be a gap between the fast region and the slow region. The slow region can extend into a gap region between the ends of alternating fingers extending from the opposite busbar, can begin at the ends of these fingers, or can be entirely within the aperture.

In one particular example, the piezoelectric plate is 391 nm thick ZY-cut lithium niobite, the slow region has a length (in a direction along the fingers) of pitch/2 and a 40 nm thick strip of $SiO_2$ over the piezoelectric plate and the fingers, and the fast region has a length (in a direction along the fingers) of 6 microns where the piezoelectric plate has been thinned to 341 nm. In exemplary devices, the fast region has an effective thickness up to 20% less than the thickness of the central portion, where the effective thickness includes all layer (e.g., piezoelectric plate, dielectric layers, and any other layers). The fast region has a width of p to 3p in the aperture direction. In the fast region, the finger dimensions may be up to 35% wider and up to thinner 25% than the central portion. The slow region has an effective thickness up to 20% thicker than the central portion. The width of the slow region along the aperture direction can be between 0.25p and 2p. The central portion thickness is such that its resonance frequency matches the required frequency.

Figure 5:
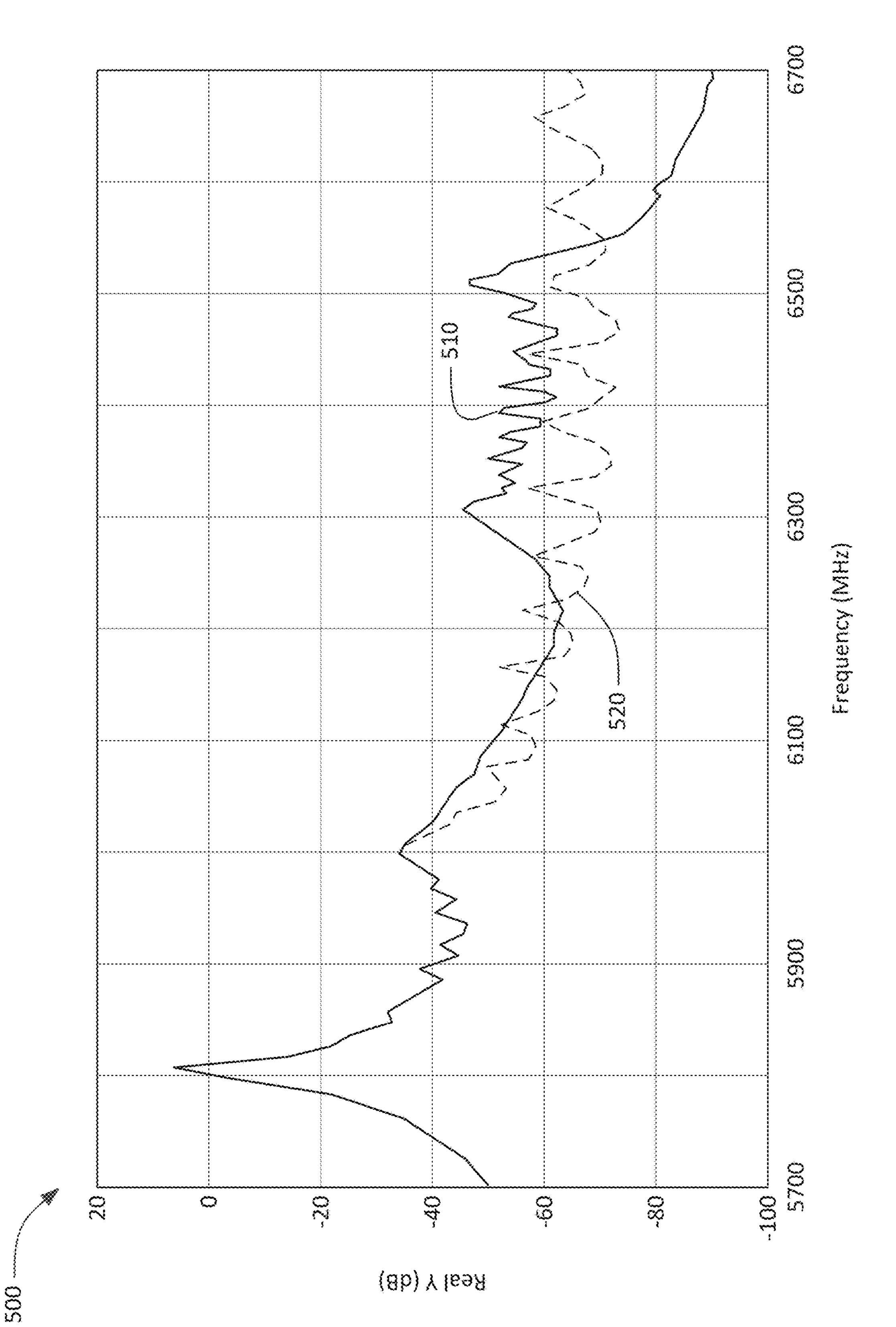
FIG. 5 is a graph of the real component of admittance as a function of frequency for an XBAR with a modified acoustic velocity region.

FIG. 5 is a graph 500 of simulated admittance as a function of frequency for XBARs with and without a modified acoustic velocity region having no dielectric layer as described with respect to FIG. 3A. Solid curve 510 is a plot of the real component of admittance (i.e. conductance) for an XBAR with an 84 nm oxide dielectric layer over the IDT, including the gap region. Dashed curve 520 is a plot of the real component of admittance for an XBAR with the dielectric layer over the IDT except in the gap region. The resonance frequency of the modified acoustic velocity region is above the antiresonance frequency, and confinement of energy is good throughout the resonance-antiresonance band. Curve 520 shows lower conductance, as compared to curve 510, over a frequency range of 6250 MHz to 6550 MHz.

Figure 6:
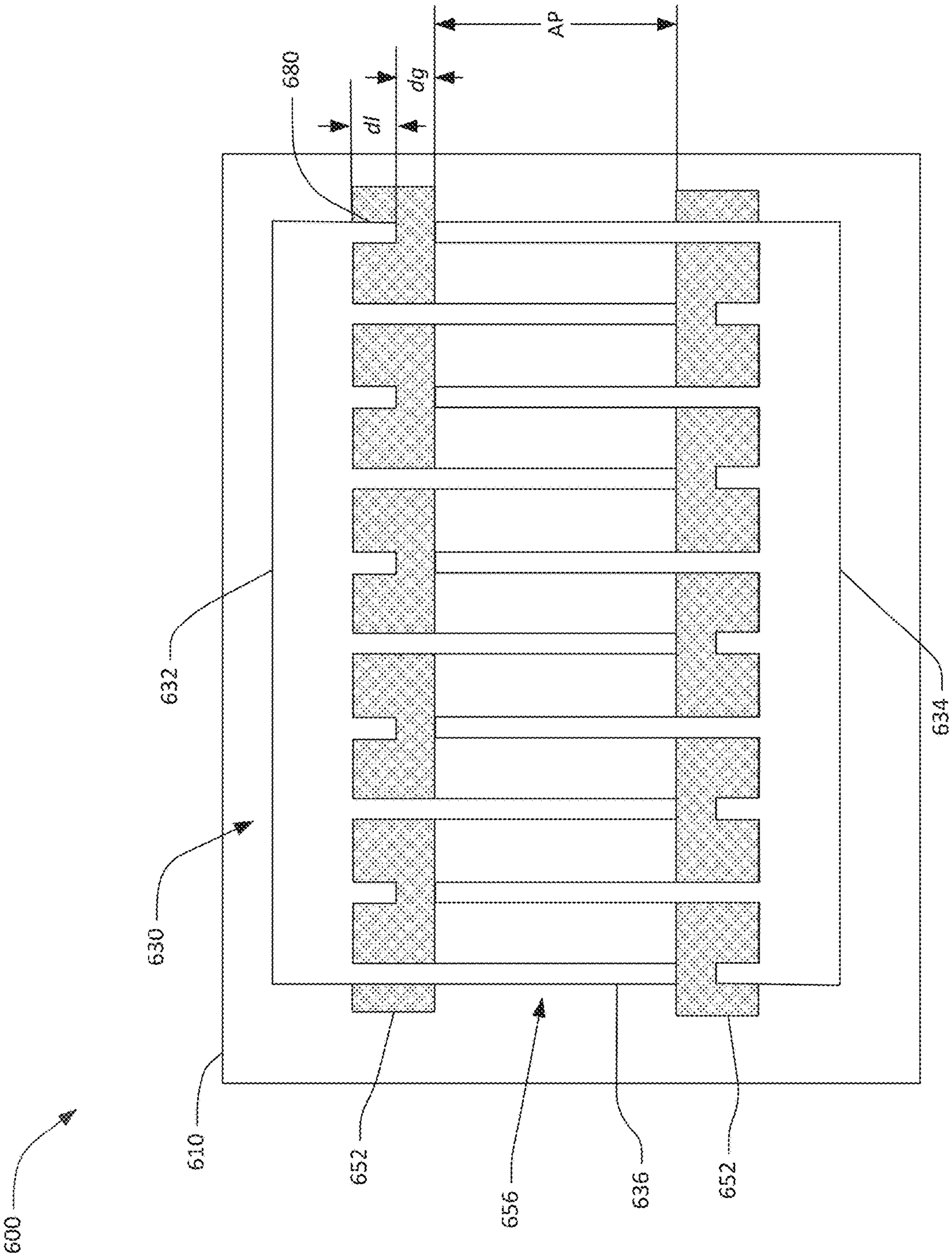
FIG. 6 is a schematic plan view of an XBAR with a modified acoustic velocity region with dummy electrodes.

FIG. 6 is a schematic plan view of an XBAR 600 with a modified acoustic velocity region including dummy electrodes. Similar to FIG. 3A and FIG. 3B, XBAR 600 includes a piezoelectric plate 610 and an IDT 630 having interleaved fingers 636 extending from busbars 632, 634 on the piezoelectric plate 610. The interleaved fingers overlap for a distance AP, referred to as the "aperture" of the IDT. Further, dummy fingers 680 having a length dl extend alternately from the busbars 632, 634 into a modified acoustic velocity region 652 between the end of a finger 636 and the busbar 632, 634. A distance from an end of the dummy finger 680 to an end of an interleaved finger is dg.

The dummy fingers can have dimensions optimized to improve functioning of the device (e.g., to improve waveguiding). Exemplary dummy fingers typically have the mark and thickness of the finger in a central portion 656, but can vary by +/−30%. A length along the aperture direction is up to the width of the modified acoustic velocity region, e.g., p to 3p. A space between a dummy finger and a tip of a finger may have a length from 300 nm to p/2. In one example, dl corresponds to or is about equal to dg. For example, both dl and dg can be in a range from 0.5 p to 2p. In one example, for a p of about 3 microns, both dl and dg can be in a range from 1.5 microns to 6 microns. In one example, dg and dl are 2.5 microns.

Optionally, a frontside dielectric layer is removed or not formed on the modified acoustic velocity region 652, as described with respect to FIGS. 3 and 4.

The primary shear acoustic mode excited by the IDT 630 in the piezoelectric plate 610 in the modified acoustic velocity region 652 has a higher frequency than the primary shear acoustic mode excited by the IDT 630 in the piezoelectric plate 610 within the central portion 656 of the aperture because of the dummy fingers 680. The portion of the modified acoustic velocity region with the dummy fingers has a higher frequency that the portion in the space between the dummy finger and the top of the finger. This results in reduced energy leakage from the ends of the fingers because improved waveguiding is achieved.

The dummy fingers can be metal (e.g., the same or different metal as the fingers) and/or one or more other materials such as $SiO_s$ or other dielectrics. The dummy fingers can have various shapes, such as a hammerhead shape with a thicker portion away from the busbar and a thinner portion near the busbar.

Figure 7:
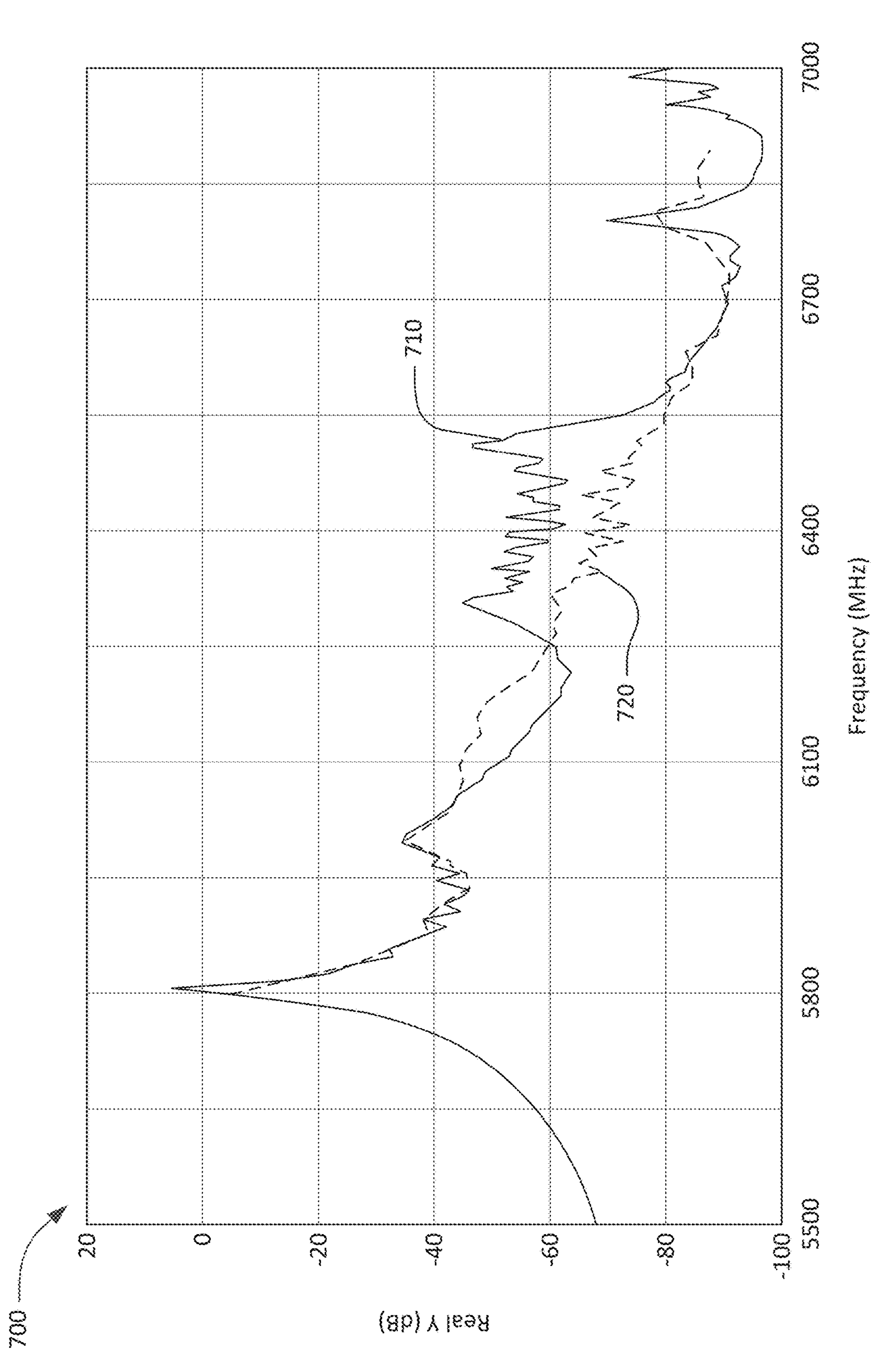
FIG. 7 is a graph of admittance as a function of frequency for an XBAR with a modified acoustic velocity region with dummy electrodes.

FIG. 7 is a graph 700 of simulated performance as a function of frequency for XBARs with and without a modified acoustic velocity region including dummy electrodes. Solid curve 710 is a plot of the real component of admittance for an XBAR without a modified acoustic velocity region. Dashed curve 720 is a plot of the real component of admittance for an XBAR with a modified acoustic velocity region including dummy electrodes where dg and dl are 2.5 microns. Curve 720 shows reduced conductance from 6.2 GHz to 6.7 GHz as compared to curve 710. Reduced conductance can result in improved insertion loss in this frequency range for a filter using this XBAR as a shunt resonator.

Description of Methods

Figure 8:
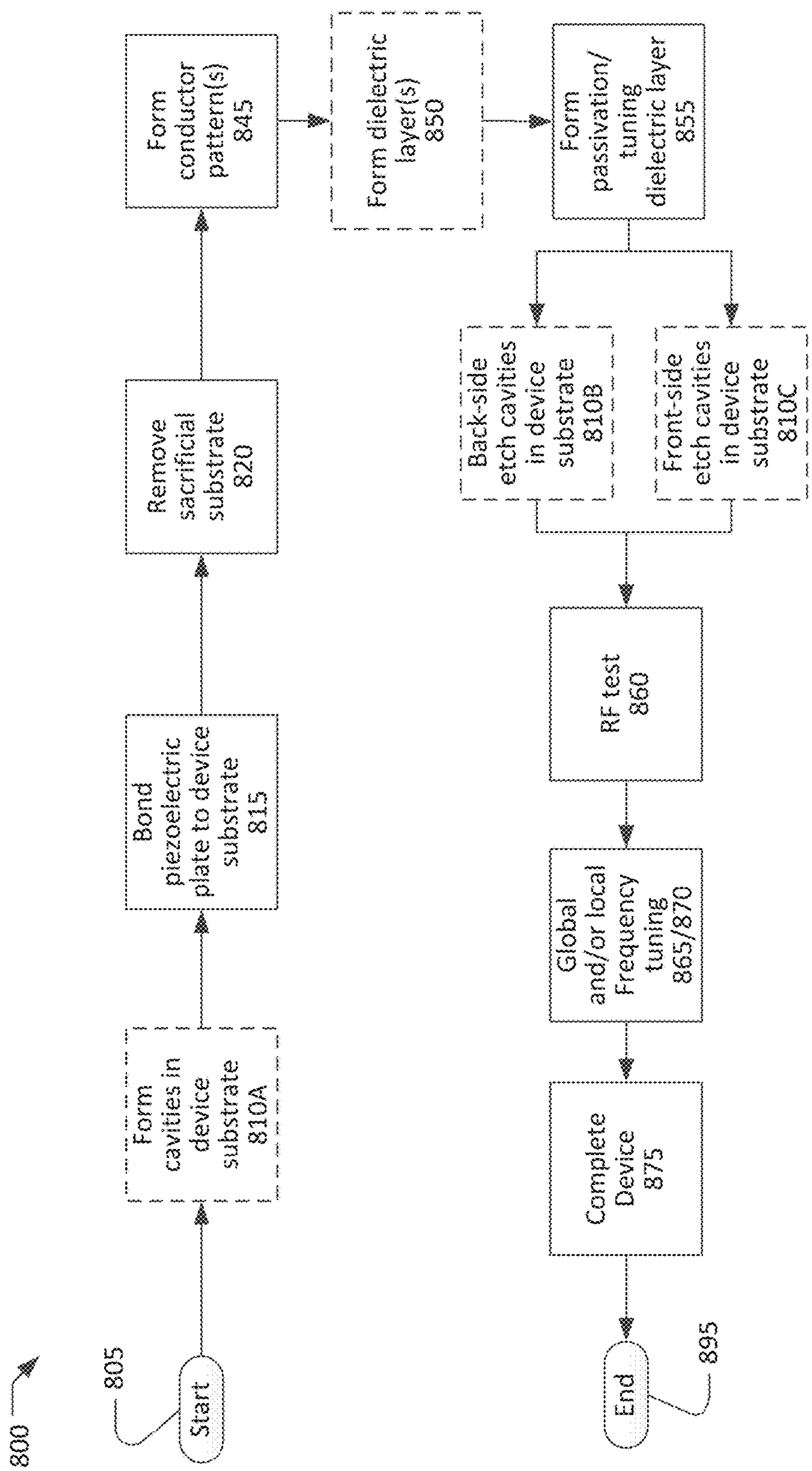
FIG. 8 is a flow chart of a method for fabricating a filter with XBAR with a modified acoustic velocity region.

FIG. 8 is a simplified flow chart summarizing a process 800 for fabricating a filter device incorporating XBARs with a modified acoustic velocity region. Specifically, the process 800 is for fabricating a filter device including multiple XBARs, some of which may include a frequency setting dielectric or coating layer. The process 800 starts at 805 with a device substrate and a thin plate of piezoelectric material disposed on a sacrificial substrate. The process 800 ends at 895 with a completed filter device. The flow chart of FIG. 8 includes only major process steps. Various conventional process steps (e.g. surface preparation, cleaning, inspection, baking, annealing, monitoring, testing, etc.) may be performed before, between, after, and during the steps shown in FIG. 8.

While FIG. 8 generally describes a process for fabricating a single filter device, multiple filter devices may be fabricated simultaneously on a common wafer (consisting of a piezoelectric plate bonded to a substrate). In this case, each step of the process 800 may be performed concurrently on all of the filter devices on the wafer.

The flow chart of FIG. 8 captures three variations of the process 800 for making an XBAR which differ in when and how cavities are formed in the device substrate. The cavities may be formed at steps 810A, 810B, or 810C. Only one of these steps is performed in each of the three variations of the process 800.

The piezoelectric plate may typically be ZY-cut or rotated YX-cut lithium niobate. The piezoelectric plate may be some other material and/or some other cut. The device substrate may preferably be silicon. The device substrate may be some other material that allows formation of deep cavities by etching or other processing.

In one variation of the process 800, one or more cavities are formed in the device substrate at 810A, before the piezoelectric plate is bonded to the substrate at 815. A separate cavity may be formed for each resonator in a filter device. Also, the cavities can be shaped and formed such that two or more resonators can be on one diaphragm over one cavity. The one or more cavities may be formed using conventional photolithographic and etching techniques. Typically, the cavities formed at 810A will not penetrate through the device substrate.

At 815, the piezoelectric plate is bonded to the device substrate. The piezoelectric plate and the device substrate may be bonded by a wafer bonding process. Typically, the mating surfaces of the device substrate and the piezoelectric plate are highly polished. One or more layers of intermediate materials, such as an oxide or metal, may be formed or deposited on the mating surface of one or both of the piezoelectric plate and the device substrate. One or both mating surfaces may be activated using, for example, a plasma process. The mating surfaces may then be pressed together with considerable force to establish molecular bonds between the piezoelectric plate and the device substrate or intermediate material layers.

At 820, the sacrificial substrate may be removed. For example, the piezoelectric plate and the sacrificial substrate may be a wafer of piezoelectric material that has been ion implanted to create defects in the crystal structure along a plane that defines a boundary between what will become the piezoelectric plate and the sacrificial substrate. At 820, the wafer may be split along the defect plane, for example by thermal shock, detaching the sacrificial substrate and leaving the piezoelectric plate bonded to the device substrate. The exposed surface of the piezoelectric plate may be polished or processed in some manner after the sacrificial substrate is detached.

A first conductor pattern, including IDTs and reflector elements of each XBAR, is formed at 845 by depositing and patterning one or more conductor layers on the front side of the piezoelectric plate. The conductor layer may be, for example, aluminum, an aluminum alloy, copper, a copper alloy, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate. A second conductor pattern of gold, aluminum, copper or other higher conductivity metal may be formed over portions of the first conductor pattern (for example the IDT busbars and interconnections between the IDTs).

Each conductor pattern may be formed at 845 by depositing the conductor layer and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, or other etching techniques.

Alternatively, each conductor pattern may be formed at 845 using a lift-off process. Photoresist may be deposited over the piezoelectric plate, and patterned to define the conductor pattern. The conductor layer and, optionally, one or more other layers may be deposited in sequence over the surface of the piezoelectric plate. The photoresist may then be removed, which removes the excess material, leaving the conductor pattern.

Optionally, dummy fingers may be formed in gap regions when the conductor pattern is formed. The dummy fingers may be formed of the same material as the conductor pattern. Alternatively, dummy fingers may be formed of different material than the conductor pattern, such as a dielectric material like $SiO_2$.

At 850, one or more frequency setting dielectric layer(s) may be formed by depositing one or more layers of dielectric material on the front side of the piezoelectric plate. For example, a dielectric layer may be formed over the shunt resonators to lower the frequencies of the shunt resonators relative to the frequencies of the series resonators. The one or more dielectric layers may be deposited using a conventional deposition technique such as physical vapor deposition, atomic layer deposition, chemical vapor deposition, or some other method. One or more lithography processes (using photomasks) may be used to limit the deposition of the dielectric layers to selected areas of the piezoelectric plate. For example, a mask may be used to limit a dielectric layer to cover only the shunt resonators.

Also at 850, the gap region may be masked when the dielectric layers are formed, to prevent formation of the dielectric layer in the gap region. Further, the dielectric layer over the gap region can be formed to be thinner than the rest of the dielectric layer. Alternatively, the dielectric layer in the gap region can be removed after dielectric formation.

At 855, a passivation/tuning dielectric layer is deposited over the piezoelectric plate and conductor patterns. The passivation/tuning dielectric layer may cover the entire surface of the filter except for pads for electrical connections to circuitry external to the filter. In some instantiations of the process 800, the passivation/tuning dielectric layer may be formed after the cavities in the device substrate are etched at either 810B or 810C.

In a second variation of the process 800, one or more cavities are formed in the back side of the device substrate at 810B. A separate cavity may be formed for each resonator in a filter device. Also, the cavities can be shaped and formed such that two or more resonators can be on one diaphragm over one cavity. The one or more cavities may be formed using an anisotropic or orientation-dependent dry or wet etch to open holes through the back side of the device substrate to the piezoelectric plate. In this case, the resulting resonator devices will have a cross-section as shown in FIG. 1.

In a third variation of the process 800, one or more cavities in the form of recesses in the device substrate may be formed at 810C by etching the substrate using an etchant introduced through openings in the piezoelectric plate. A separate cavity may be formed for each resonator in a filter device. Also, the cavities can be shaped and formed such that two or more resonators can be on one diaphragm over one cavity. The one or more cavities formed at 810C will not penetrate through the device substrate.

Ideally, after the cavities are formed at 810B or 810C, most or all of the filter devices on a wafer will meet a set of performance requirements. However, normal process tolerances will result in variations in parameters such as the thicknesses of dielectric layer formed at 850 and 855, variations in the thickness and line widths of conductors and IDT fingers formed at 845, and variations in the thickness of the piezoelectric plate. These variations contribute to deviations of the filter device performance from the set of performance requirements.

To improve the yield of filter devices meeting the performance requirements, frequency tuning may be performed by selectively adjusting the thickness of the passivation/tuning layer deposited over the resonators at 855. The frequency of a filter device passband can be lowered by adding material to the passivation/tuning layer, and the frequency of the filter device passband can be increased by removing material to the passivation/tuning layer. Typically, the process 800 is biased to produce filter devices with passbands that are initially lower than a required frequency range but can be tuned to the desired frequency range by removing material from the surface of the passivation/tuning layer.

At 860, a probe card or other means may be used to make electrical connections with the filter to allow radio frequency (RF) tests and measurements of filter characteristics such as input-output transfer function. Typically, RF measurements are made on all, or a large portion, of the filter devices fabricated simultaneously on a common piezoelectric plate and substrate.

At 865, global frequency tuning may be performed by removing material from the surface of the passivation/tuning layer using a selective material removal tool such as, for example, a scanning ion mill as previously described. "Global" tuning is performed with a spatial resolution equal to or larger than an individual filter device. The objective of global tuning is to move the passband of each filter device towards a desired frequency range. The test results from 860 may be processed to generate a global contour map indicating the amount of material to be removed as a function of two-dimensional position on the wafer. The material is then removed in accordance with the contour map using the selective material removal tool.

At 870, local frequency tuning may be performed in addition to, or instead of, the global frequency tuning performed at 865. "Local" frequency tuning is performed with a spatial resolution smaller than an individual filter device. The test results from 860 may be processed to generate a map indicating the amount of material to be removed at each filter device. Local frequency tuning may require the use of a mask to restrict the size of the areas from which material is removed. For example, a first mask may be used to restrict tuning to only shunt resonators, and a second mask may be subsequently used to restrict tuning to only series resonators (or vice versa). This would allow independent tuning of the lower band edge (by tuning shunt resonators) and upper band edge (by tuning series resonators) of the filter devices.

After frequency tuning at 865 and/or 870, the filter device is completed at 875. Actions that may occur at 875 include forming bonding pads or solder bumps or other means for making connection between the device and external circuitry (if such pads were not formed at 845); excising individual filter devices from a wafer containing multiple filter devices; other packaging steps; and additional testing. After each filter device is completed, the process ends at 895.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. An acoustic resonator device comprising:

a piezoelectric layer having front and back surfaces;

an interdigital transducer (IDT) on the front surface comprising interleaved fingers extending from opposing busbars, an overlapping distance of the interleaved fingers defining an aperture of the acoustic resonator device;

a modified acoustic velocity region proximate an edge of the aperture; and a dielectric layer on the piezoelectric layer and in the modified acoustic velocity region, wherein the dielectric layer is thinner in the modified acoustic velocity region than in a central portion of the aperture of the acoustic resonator device, wherein the acoustic resonator device further comprises a slow region adjacent the modified acoustic velocity region and proximate the edge of the aperture, and a strip of dielectric material on the piezoelectric layer over a portion of the interleaved fingers in the slow region, wherein the IDT further comprises at least one dummy finger in the modified acoustic velocity region between at least one interleaved finger of the interleaved fingers and one busbar of the opposing busbars, wherein the at least one dummy finger extends from the one busbar of the opposing busbars, and wherein a length of the at least one dummy finger corresponds to a distance between the at least one dummy finger and the at least one interleaved finger, wherein the interleaved fingers are disposed at a first portion of the piezoelectric layer and each of the opposing busbars are disposed at a second portion of the piezoelectric layer, and wherein a device thickness of the modified acoustic velocity region is thinner than device thicknesses of each of the first portion and the second portion.

2. The acoustic resonator device of claim 1, wherein the IDT further comprises a plurality of dummy fingers including the at least one dummy finger in the modified acoustic velocity region.

3. The acoustic resonator device of claim 1, wherein the interleaved fingers extend alternately from the opposing busbars, and wherein the modified acoustic velocity region is outside of the aperture and between an end of each interleaved finger of the interleaved fingers and one of the busbars of the opposing busbars.

4. The acoustic resonator device of claim 1, wherein the modified acoustic velocity region is configured to reduce acoustic energy leakage as compared to an acoustic resonator device without a modified acoustic velocity region.

5. The acoustic resonator device of claim 1, wherein:

the opposing busbars include a first busbar and a second busbar, the interleaved fingers extend alternately from the first and second busbars, the modified acoustic velocity region extends from the first busbar towards the interleaved fingers extending from the second busbar, and the modified acoustic velocity region overlaps at least a portion of the interleaved fingers extending from the second busbar in a plan view of the first surface of the piezoelectric layer.

6. The acoustic resonator device of claim 1, wherein a pitch of the IDT is 2 to 20 times a thickness of the piezoelectric layer.

7. The acoustic resonator device of claim 1, wherein a pitch of the IDT is 3.3 to 5 times a width of the interleaved fingers.

8. A filter device comprising:

a piezoelectric layer having front and back surfaces;

a conductor pattern on the front surface, the conductor pattern comprising a plurality of interdigital transducers (IDTs) of a respective plurality of resonators, each of the plurality of IDTs comprising interleaved fingers extending from opposing busbars, an overlapping distance of the interleaved fingers of each of the plurality of IDTs defining an aperture of a respective resonator of the plurality of resonators, wherein at least one resonator of the plurality of resonators comprises a modified acoustic velocity region proximate an edge of the aperture, and wherein the at least one resonator comprises a dielectric layer on the piezoelectric layer and in the modified acoustic velocity region, the dielectric layer being thinner in the modified acoustic velocity region than in a central portion of the aperture of the at least one resonator, wherein the at least one resonator further comprises a slow region adjacent the modified acoustic velocity region and proximate the edge of the aperture, and a strip of dielectric material on the piezoelectric layer over a portion of the interleaved fingers in the slow region, wherein the IDT of the at least one resonator further comprises at least one dummy finger in the modified acoustic velocity region between at least one interleaved finger of the interleaved fingers and one busbar of the opposing busbars, wherein the at least one dummy finger extends from the one busbar of the opposing busbars, and wherein a length of the at least one dummy finger corresponds to a distance between the at least one dummy finger and the at least one interleaved finger, wherein, for the at least one resonator, the interleaved fingers are disposed at a first portion of the piezoelectric layer and each of the opposing busbars are disposed at a second portion of the piezoelectric layer, and wherein, for the at least one resonator, a device thickness of the modified acoustic velocity region is thinner than device thicknesses of each of the first portion and the second portion.

9. The filter device of claim 8, wherein the IDT of the at least one resonator of the plurality of resonators further comprises a plurality of dummy fingers including the at least one dummy finger in the modified acoustic velocity region.

10. The filter device of claim 9, wherein the modified acoustic velocity region is configured to reduce acoustic energy leakage as compared to a resonator without a modified acoustic velocity region.

11. The filter device of claim 8, wherein the interleaved fingers of the at least one resonator of the plurality of resonators extend alternately from the opposing busbars, and wherein the modified acoustic velocity region is outside of the aperture and between an end of each interleaved finger of the at least one resonator and one of the busbars of the opposing busbars.

12. The filter device of claim 8, wherein, for the at least one resonator:

the opposing busbars include a first busbar and a second busbar, the interleaved fingers extend alternately from the first and second busbars, the modified acoustic velocity region extends from the first busbar towards the interleaved fingers extending from the second busbar, and the modified acoustic velocity region overlaps at least a portion of the interleaved fingers extending from the second busbar in a plan view of the first surface of the piezoelectric layer.

13. The filter device of claim 8, wherein a pitch of the IDT of the at least one resonator is 2 to 20 times a thickness of the piezoelectric layer.

14. The filter device of claim 8, wherein a pitch of the IDT of the at least one resonator is 3.3 to 5 times a width of the interleaved fingers.

15. A method of fabricating an acoustic resonator device comprising:

forming an interdigital transducer (IDT) on a front side of a piezoelectric layer, the IDT comprising interleaved fingers extending from opposing busbars, an overlapping distance of the interleaved fingers defining an aperture of an acoustic resonator device;

forming a modified acoustic velocity region proximate an edge of the aperture;

forming a dielectric layer on the piezoelectric layer and in the modified acoustic velocity region; and forming a slow region adjacent the modified acoustic velocity region and proximate the edge of the aperture, and a strip of dielectric material on the piezoelectric layer over a portion of the interleaved fingers in the slow region, wherein the dielectric layer is thinner in the modified acoustic velocity region than in a central portion of the aperture of the acoustic resonator device, wherein the IDT is formed to further comprise at least one dummy finger in the modified acoustic velocity region between at least one interleaved finger of the interleaved fingers and one busbar of the opposing busbars, wherein the at least one dummy finger extends from the one busbar of the opposing busbars, and wherein a length of the at least one dummy finger corresponds to a distance between the at least one dummy finger and the at least one interleaved finger, wherein the interleaved fingers are disposed at a first portion of the piezoelectric layer and each of the opposing busbars are disposed at a second portion of the piezoelectric layer, and wherein a device thickness of the modified acoustic velocity region is thinner than device thicknesses of each of the first portion and the second portion.

16. The method of claim 15, further comprising forming a plurality of dummy fingers including the at least one dummy finger in the modified acoustic velocity region.

17. The method of claim 15, wherein the interleaved fingers extend alternately from the opposing busbars, and wherein the modified acoustic velocity region is outside of the aperture and between an end of each interleaved finger and one of the busbars of the opposing busbars.

18. The method of claim 15, wherein:

forming the IDT comprises forming the IDT to include the interleaved fingers to extend alternately from the opposing busbars, and forming the modified acoustic velocity region comprises forming the modified acoustic velocity region to extend from a first busbar of the opposing busbars towards the interleaved fingers extending from a second busbar of the opposing busbars, and to overlap at least a portion of the interleaved fingers extending from the second busbar in a plan view of the first surface of the piezoelectric layer.

* * * * *